United States Patent [19]

Nakamura

[11] Patent Number: 5,841,160
[45] Date of Patent: Nov. 24, 1998

[54] SEMICONDUCTOR DEVICE HAVING A CAPACITOR ELECTRODE MADE OF IRIDIUM

[75] Inventor: Takashi Nakamura, Kyoto, Japan

[73] Assignee: Rohm Co., Ltd., Kyoto, Japan

[21] Appl. No.: 637,443

[22] Filed: Apr. 25, 1996

[30] Foreign Application Priority Data

Apr. 28, 1995 [JP] Japan .................. 7-105589

[51] Int. Cl.$^6$ .................. H01L 29/76; H01L 29/00; H01L 23/48
[52] U.S. Cl. .................. 257/295; 257/535; 257/769
[58] Field of Search .................. 257/295, 769, 257/535

[56] References Cited

U.S. PATENT DOCUMENTS

| | | | |
|---|---|---|---|
| 4,026,742 | 5/1977 | Fujino | 156/643 |
| 5,070,379 | 12/1991 | Nomoto et al. | 252/412 |
| 5,191,510 | 3/1993 | Huffman | 257/295 |
| 5,486,713 | 1/1996 | Koyama | 252/310 |
| 5,510,651 | 4/1996 | Maniar et al. | 257/295 |
| 5,555,486 | 9/1996 | Kingon et al. | 257/295 |

FOREIGN PATENT DOCUMENTS

| | | |
|---|---|---|
| 0 587 990 A2 | 3/1994 | European Pat. Off. . |
| 0 629 002 A1 | 12/1994 | European Pat. Off. . |
| 49-75270 | 7/1974 | Japan . |
| 54-41870 | 12/1979 | Japan . |
| 3-253065 | 11/1991 | Japan . |
| 3-257858 | 11/1991 | Japan . |
| 6-97121 | 4/1994 | Japan . |
| 7-99290 | 4/1994 | Japan . |

*Primary Examiner*—Teresa M. Arroyo
*Attorney, Agent, or Firm*—Merchant, Gould, Smith, Edell, Welter & Schmidt

[57] ABSTRACT

An iridium layer (16) is formed on an inter-layer insulation film (12) and in an opening (14). The iridium layer (16) is constituted with a part to be a lower electrode (16a) of a capacitor and a part to be a wiring (16b) for coming into contact with a drain zone (6). On part of the lower electrode (16a) of the iridium layer (16) is formed a ferroelectric layer (18) made of PZT on which is further formed an iridium layer (20) as an upper electrode. Since the melting point of iridium is higher than that of aluminum, there is no possibility of iridium melting even if heat treatment is carried out after forming the iridium layer (16). Since reactivity between iridium and silicon is low, unnecessary silicon compound is not produced on the interface to provide favorable contact.

2 Claims, 6 Drawing Sheets

SEMICONDUCTOR DEVICE HAVING A CAPACITOR ELECTRODE MADE OF IRIDIUM

BACKGROUND OF THE INVENTION

1. Field of the Invention

This invention relates to wiring of semiconductor elements.

2. Description of the Prior Art

Heretofore, Al, W, Ta, Ti, their silicides, aluminum alloy (Al—Si—Cu),etc., copper, copper alloy, polysilicon doped with impurities, etc. have been used for wiring of semiconductors. However, when aluminum is used, there is a problem that heat treatment cannot be performed above 450° C. after forming with aluminum, because aluminum melts at temperatures above 450° C. Polysilicon having a high melting point does not pose such a problem. However, since polysilicon has a high resistance, it is unsuitable for wirings of a long distance or with fine wires.

Alternatively when aluminum is formed on the silicon layer, aluminum enters (spikes) into the silicon and may cause breakage of wires. In order to overcome such problems, a conventional method has been to form a thin layer of TiN as a barrier layer on the silicon layer over which aluminum layer is formed. The TiN barrier layer prevents diffusion (spiking) of silicon into the aluminum.

However, when the TiN barrier layer is formed and then heat-treated in an atmosphere containing $O_2$, a possible problem is that Ti is oxidized to form nonconductive titanium oxide so that contacts cannot be made. Another problem is that since TiN is very hard, it may separate from the metals or silicon because of difference in coefficients of thermal expansion.

SUMMARY OF THE INVENTION

The object of this invention is to provide a semiconductor device with high performance wiring capable of solving the above-described problems.

A semiconductor device of this invention comprises:

a semiconductor substrate, a semiconductor element zone defined on or in said semiconductor substrate, and a wiring section connected to said semiconductor element zone, said wiring section being formed with iridium.

A semiconductor device of this invention comprises:

a semiconductor substrate, a semiconductor element zone defined on or in said semiconductor substrate, and a wiring section connected to said semiconductor element zone, said wiring section being formed with iridium oxide.

A semiconductor device of this invention comprises:

a semiconductor substrate, a semiconductor element zone defined on or in said semiconductor substrate, and a wiring section connected to said semiconductor element zone, said wiring section being formed with a barrier layer and a main conducting layer, and said barrier layer being formed with iridium oxide.

The wiring of this invention is characterized in that the wiring section connected to the semiconductor element zone is made by forming an iridium oxide layer as a barrier layer in contact with the semiconductor element zone, and forming a main conducting layer on the barrier layer.

An element with a dielectric of this invention comprises:

a dielectric layer, and a wiring section extending from a conducting layer formed just below said dielectric, said wiring section being formed integral with said conducting layer, said conducting layer and said wiring section being formed with iridium or iridium oxide.

DETAILED DESCRIPTION OF THE INVENTION

Figure 1:
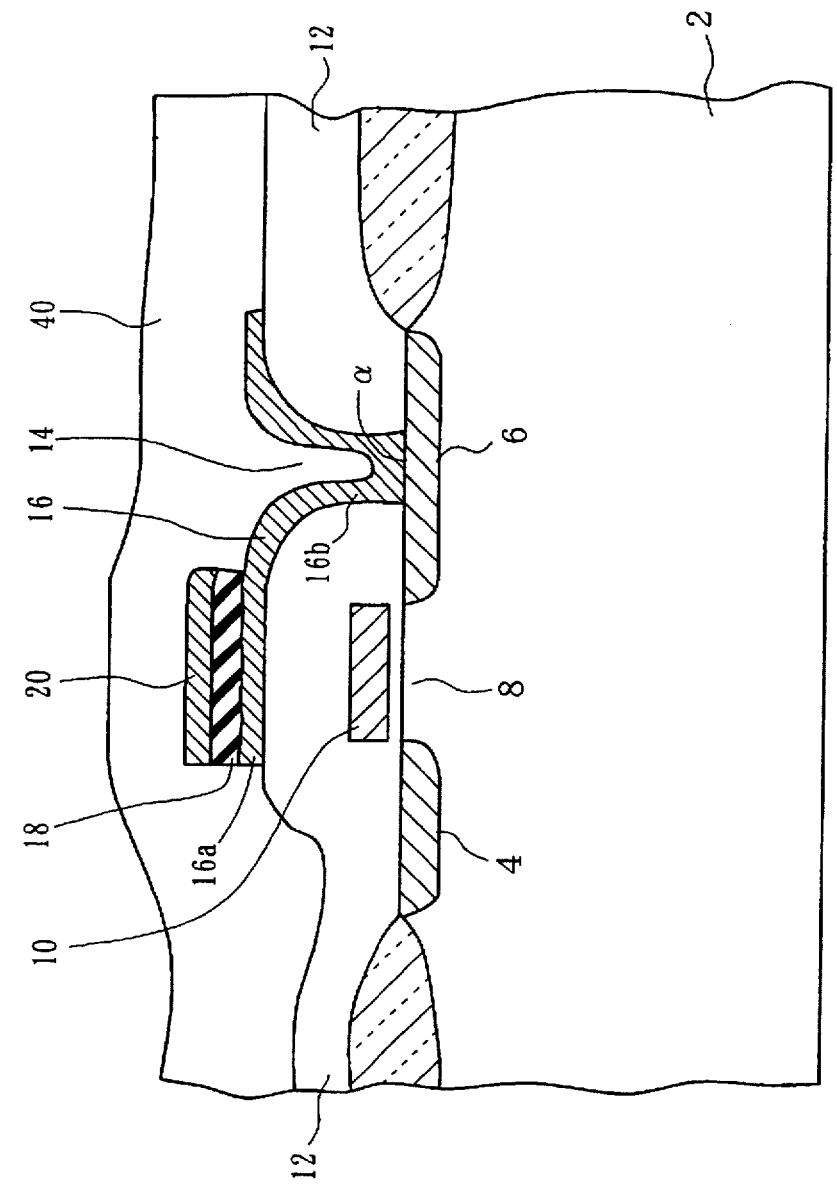
FIG. 1 shows an example of a semiconductor device as an embodiment of this invention.

FIG. 1 shows an example constitution of a semiconductor device as an embodiment of this invention. In this embodiment, a source zone (4) and a drain zone (6) are formed on a substrate (2). A gate electrode (10) is formed on a channel zone (8) between the source zone (4) and the drain zone (6) through an insulation film. An inter-layer insulation film (12) is formed over the above-mentioned components. An opening (14) is formed in the insulation layer (12) at a position above the drain zone (6).

An iridium layer (16) is formed on the inter-layer insulation film (12) and inside the opening (14). The iridium layer (16) consists of a part to be a lower electrode (16a) and a part to be a wiring (16b) for contact with the drain zone (6). On part of the lower electrode (16a) of the iridium layer (16) is formed a ferroelectric layer (18) made of PZT over which is formed an iridium layer (20) as an upper electrode.

A manufacturing process of the semiconductor device shown in FIG. 1 is shown in FIGS. 2 and 3. First, an element separation zone (30) is formed by LOCOS on the silicon substrate (2) and at the same time a gate oxidation film (32) is formed. On the gate oxidation film (32) is formed a gate electrode (10) using polysilicon or polycide. The gate electrode (10) is masked, ions are implanted and diffused, and the source zone (4) and the drain zone (6) are formed (See FIG. 2A).

Figure 2A:
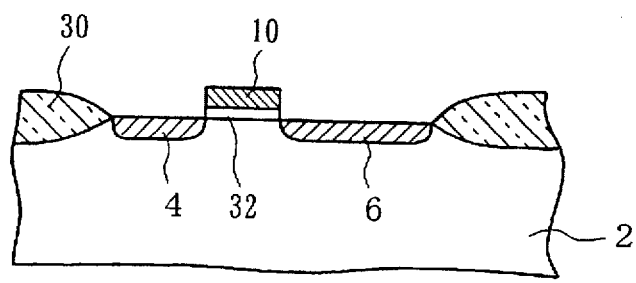
FIGS. 2A through 2D show a manufacturing flow of the semiconductor device shown in FIG. 1.
Figure 2B:
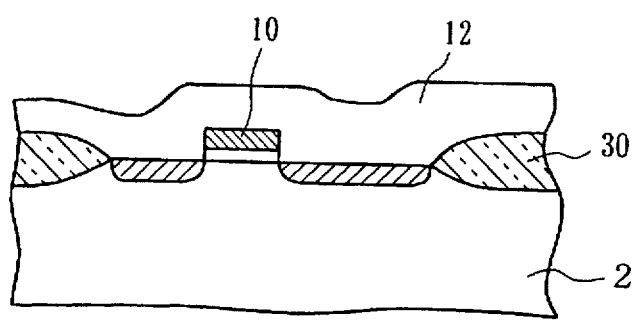
Figure 2C:
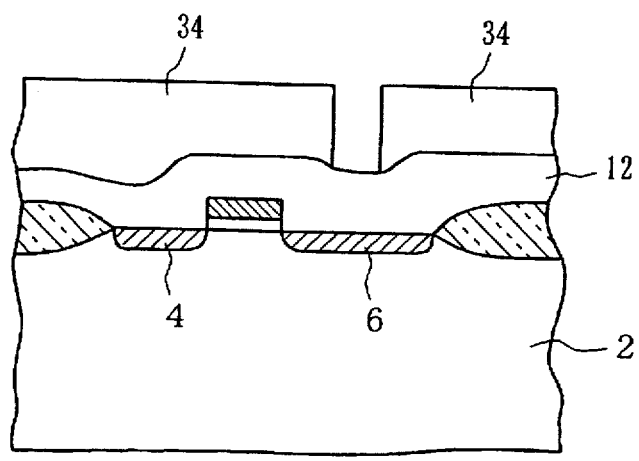
Figure 2D:
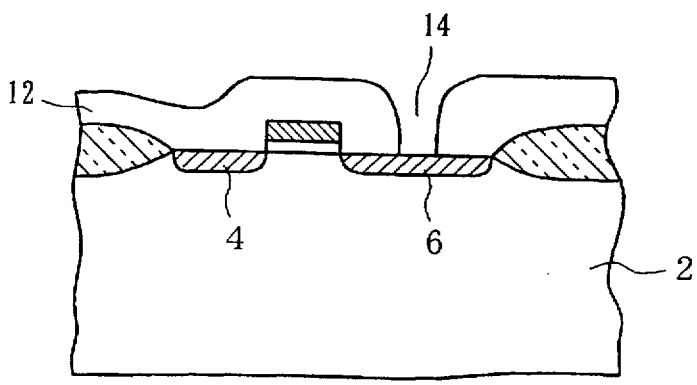
Figure 3A:
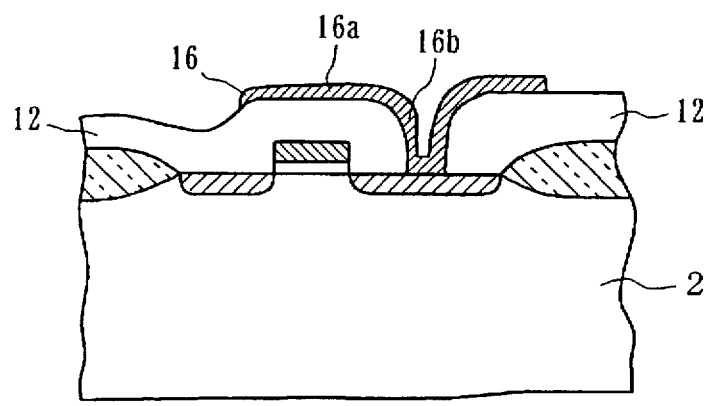
FIGS. 3A through 3C show a manufacturing flow of the semiconductor device shown in FIG. 1.

On the product prepared as described above is formed an inter-layer insulation film (12) of $SiO_2$ or BPSG to a thickness of 6000 angstroms by the CVD process (See FIG. 2B). After that, in order to form an opening in the inter-layer insulation film (12) above the drain zone (6), a photoresist mask (34) is formed as shown in FIG. 2C. In compliance with the mask (34), the inter-layer insulation film (12) is etched to form the opening (14) (See FIG. 2D).

In that state, an iridium layer (16) is formed over the entire surface by sputtering, CVD, or vacuum deposition process, and then the product is subjected to dry etching process such as RIE, ion milling or ECR to leave required parts only (See FIG. 3A) using gas such as Ar, and $Cl_2$. By the way, the dry etching may be replaced with the wet etching.

Next, on these iridium layer (16) and the inter-layer insulation film (12) a PZT film as a ferroelectric layer (18) is formed by sol-gel process. As a starting material, mixed solution of $Pb(CH_3COO)_2.3H_2O$, $Zr(T-OC_4H_9)_4$, and $Ti(i-OC_3H_7)_4$ is used. After applying the mixed solution to the product by spin coating, it is dried at 150° C., and subjected to temporary baking at 400° C. for 30 seconds. This process is repeated for five times and then the product is subjected to heat treatment in $O_2$ atmosphere at a temperature of 700° C. or higher. Thus the ferroelectric layer (18) of 250 nm thick is obtained.

Figure 3B:
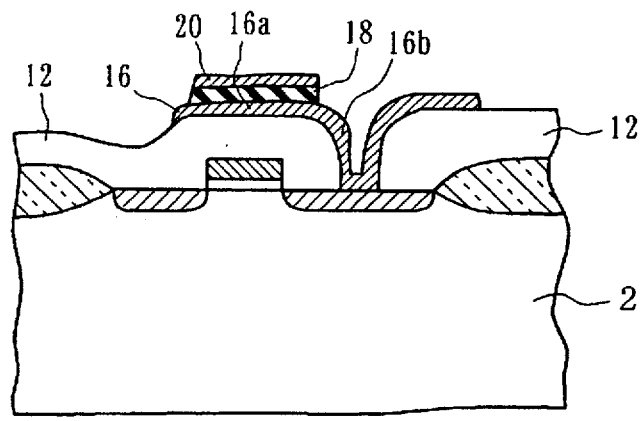
Figure 3C:
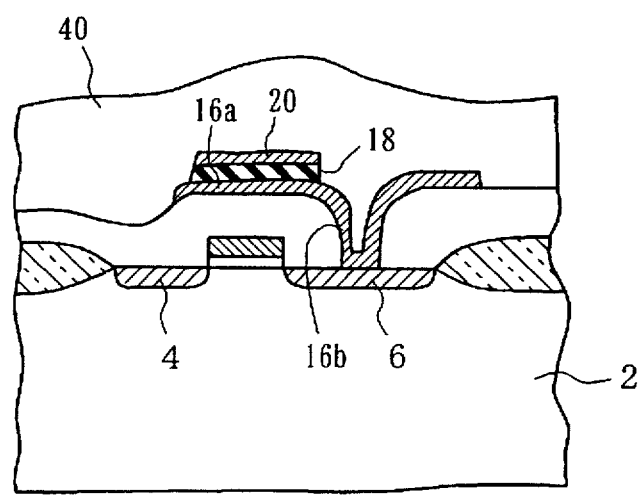

The above product is further coated with an iridium layer (20) as an upper electrode by sputtering, CVD or vacuum deposition. Then, unnecessary parts are removed by etching to leave the ferroelectric layer (18) and the iridium layer (20) only on the part above the lower electrode (16a) as shown in FIG. 3B. Next, a protection film (40) of $Si_3N_4$ or $SiO_2$ is formed by plasma CVD (See FIG. 3C).

In this embodiment, the iridium layer (16) is used for the lower electrode (16a) and the wiring (16b). Since the melting point of iridium is higher than that of aluminum, there is no problem of iridium melting under heat treatment for PZT after forming the iridium layer (16). Therefore, the iridium layer (16) is used not only for the lower electrode (16a) but also for the wiring (16b) as shown in FIG. 1. Furthermore, even if iridium is oxidized during the heat treatment, since iridium oxide produced is electricity conducting, performance as the electrode and wiring is not affected. Another advantage is that the iridium layer (16) has less electric resistance than polysilicon and others.

Figure 6:
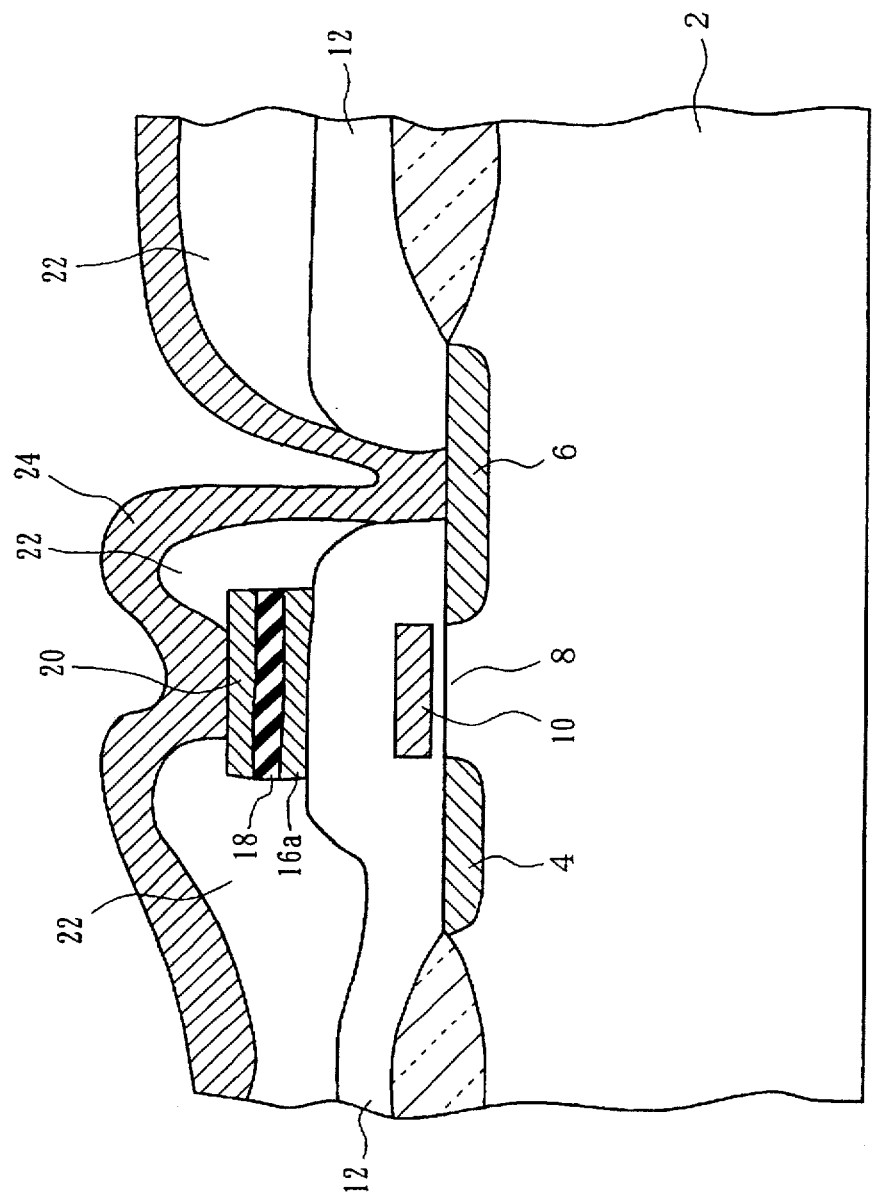
FIG. 6 shows a conventional semiconductor device.

In contrast to the above, if aluminum (24) is used for the wiring as shown in FIG. 6, the aluminum film (24) must be formed after the PZT film is formed. This makes an additional insulation layer (22) necessary and makes the constitution complicated.

Furthermore, in the embodiment shown in FIG. 1, the lower electrode (16a) and the wiring (16b) are simultaneously formed to facilitate the manufacture.

Another advantage is that the use of iridium for the lower electrode (16a) improves the dielectric property of the ferroelectric layer (18) formed over the lower electrode (16a) in comparison with electrodes made of platinum, etc.

While the PZT film is formed as the ferroelectric layer (18) in the above embodiment, PLZT, $BaTiO_3$, $BiSr_2Ta_2O_9$, etc. may also be formed. Furthermore, in place of the ferroelectric layer (18), a dielectric layer having a high dielectric constant may be formed (such as a high dielectric constant thin film having a perovskite structure of $SrTiO_3$ and $(Sr,Ba)TiO_3$).

Figure 4:
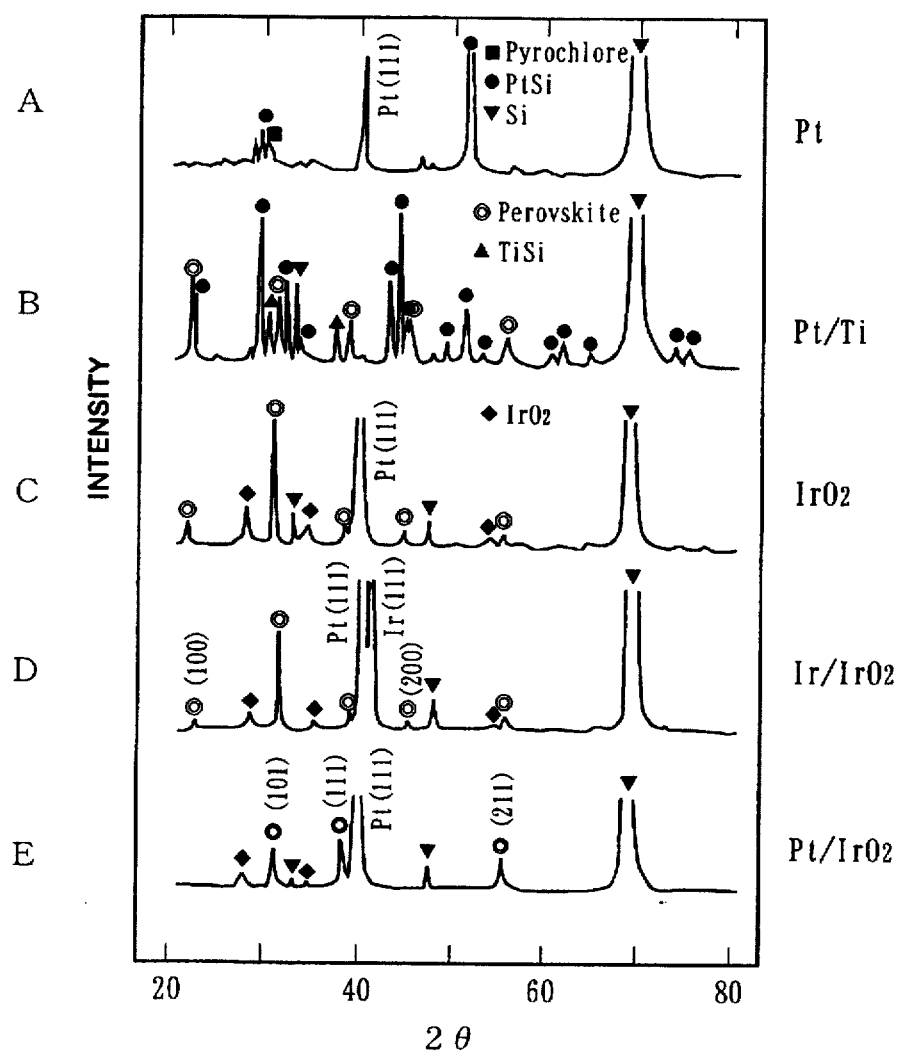
FIG. 4 is a chart showing results of X-ray analysis to clarify non-reaction between iridium oxide and silicon.

While the iridium layer (16) is used for the wiring (16b) and the lower electrode (16a) in the above embodiment, this may be replaced with an iridium oxide layer. Iridium oxide is preferable for wiring because of its good adhesion to silicon. Iridium oxide may be formed by reactive sputtering process, etc. Another advantage is that since the reactivity between iridium oxide and silicon is very low, there is no possible problem of silicide being produced on the boundary surface α (See FIG. 1) facing the drain zone (6). To prove this, various kinds of metals are formed on a silicon substrate, analyzed with X-rays, and the results are shown in the chart shown in FIG. 4. FIG. 4A shows the result for platinum, FIG. 4B for titanium covered with platinum, FIG. 4C for iridium, FIG. 4D for iridium oxide covered with iridium, and FIG. 4E for iridium oxide covered with platinum. As is clear from the comparison between FIGS. 4A and 4C, platinum produces a compound with silicon but iridium does not produce a compound with silicon.

Alternatively, when iridium oxide is formed, it may also be formed under oxygen lacking condition as $IrO_{2-x}$ (X=0–2). In this way, oxides (such as silicon oxide), even if produced on the boundary surface, may be reduced (to silicon). In other words, undesirable oxides formed on the boundary surface may be eliminated.

While simultaneous forming of the electrode and wiring is described in the above embodiment, this invention may also be applied when the wiring only is formed.

Figure 5:
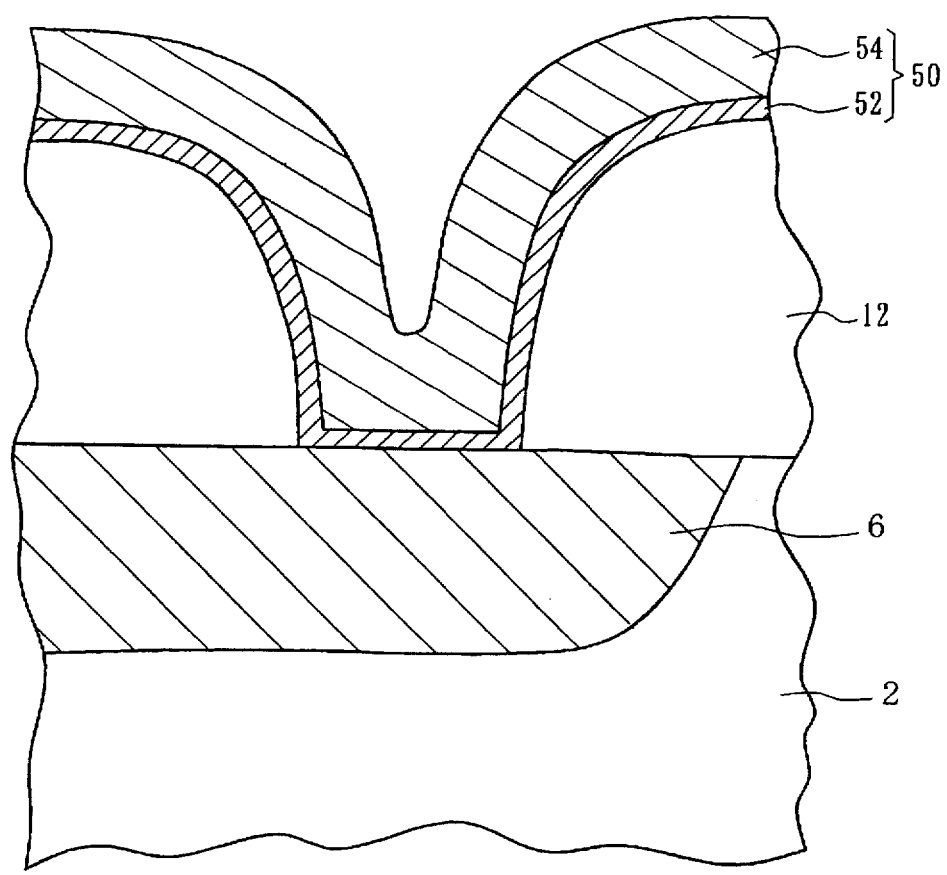
FIG. 5 shows another embodiment of the semiconductor device.

A semiconductor device according to another embodiment of this invention is shown in FIG. 5. In this embodiment, a wiring (50) is formed with an iridium oxide layer (52) as a barrier layer and an iridium layer (54) formed as a main conducting layer formed on the iridium oxide layer (52). Forming the iridium oxide layer (52) as the barrier layer, adhesion to silicon is improved. In this embodiment, since the main conducting layer is formed with the iridium layer (54), electric resistance is lowered in comparison with the case in which the entire wiring is made with iridium oxide only.

While the main conducting layer in the above embodiment is formed with the iridium layer, it may also be formed with platinum or aluminum. In that case, metal in the main conducting layer is prevented from spiking into silicon by the barrier effect of an iridium oxide layer (52) (See FIG. 4E).

Also the iridium oxide layer (52) of this embodiment may be prevented from producing oxides by forming the layer as $IrO_{2-x}$ (x=0–2) under the condition of insufficient oxygen.

In the semiconductor device and wiring method of this invention, wiring parts are made of iridium or iridium oxide. As a result, the wiring is less affected by high temperatures and no insulating substance is produced on the interface with silicon, etc.

According to this invention relating to semiconductor device and wiring, iridium oxide is made under a condition of insufficient oxygen. Therefore, oxides are prevented from being produced on the interface facing silicon and others.

According to this invention relating to semiconductor device and wiring, the wiring section is made up of a barrier layer and a main conducting layer, with the barrier layer made of iridium oxide. Therefore, the barrier layer has a good barrier function and good adhesion to silicon and aluminum.

In the element with the dielectric of this invention, the wiring section is formed as an integral extension of the conducting layer formed just below the dielectric, and the conducting layer and the wiring section are made of iridium or iridium oxide. Therefore, not only can the dielectric may be formed by heat treatment after forming the conducting section but the conducting layer and the wiring section may be formed integrally.

What is claimed is:

1. A semiconductor device comprising:

a semiconductor substrate having a semiconductor element zone, said semiconductor substrate made of silicon;

an insulation layer on said semiconductor substrate, said insulation layer having an opening so as to expose a part of said semiconductor element zone; and a wiring section on said insulation layer, said wiring section comprising a barrier layer made of iridium oxide on said insulation layer and a main conducting layer made of iridium on said barrier layer, said barrier layer being connected to said semiconductor element zone.

2. The semiconductor device of claim 1, characterized in that said iridium oxide is formed under a condition of insufficient oxygen.

* * * * *